May 19, 1970 ISAMU YAMAMOTO 3,513,362

SEMICONDUCTOR DEVICE WITH SUPPORT BLOCK SECURED ON HEAT DISSIPATION PLATE

Filed May 9, 1968

United States Patent Office 3,513,362

Patented May 19, 1970

3,513,362

SEMICONDUCTOR DEVICE WITH SUPPORT BLOCK SECURED ON HEAT DISSIPATION PLATE

Isamu Yamamoto, Itami, Japan, assignor to Mitsubishi Denki Kabushiki Kaisha, Tokyo, Japan Filed May 9, 1968, Ser. No. 727,900
Claims priority, application Japan, May 16, 1967, 42/40,952
Int. Cl. H01l 1/12
U.S. Cl. 317—234 2 Claims

ABSTRACT OF THE DISCLOSURE

A metallic support block secured on one end surface of a semiconductor device is put in intimate contact with a heat dissipation plate by a retaining metallic annulus complemental in configuration to the support block and provided on the periphery of one end with an axial projection welded to the plate with a gap betweei the block and the plate filled with a soft metal.

BACKGROUND OF THE INVENTION

Field of the invention

This invention relates to mounting of a semiconductor device to a heat dissipation member.

Description of the prior art

There have been heretofore proposed various means to mount a semiconductor device to a heat dissipation plate. For example, one of such means was to press fit a knurled circular end portion of a semiconductor device into the corresponding circular hole extending through a heat dissipation plate thereby to transfer heat generated in the semiconductor device to the heat dissipation plate. This led to the disadvantages that the circular hole should be machined with a high degree of machining accuracy and that the heat dissipation plate could not be very thin. Also the plate underwent a limitation as to the type of its material because the material had preferably a high limit of elasticity.

Alternatively a semiconductor device could be mounted on a heat dissipation plate by having its bottom surface brazed to the plate by any suitable brazing material such as a low melting-point solder comprising essentially tin and lead. This mounting operation was relatively simply performed but it was disadvantageous in that as the bottom surface of the semiconductor device, the brazing agent and the heat dissipation plate were composed of dissimilar materials the repeated heat cycles of the device caused a fatigue failure of the brazing agent lowest in strength among them.

Also, in order to mount a semiconductor device on a heat dissipation plate, the device could be secured to a support member of circular cross section having a larger diameter than the device. Then a flanged circular annulus was fitted onto the support member and fastened to the heat dissipation plate by screws. This measure caused no fatigue failure as above described but it was disadvantageous in that the number of components increased.

SUMMARY OF THE INVENTION

Accordingly it is an object of the invention to eliminate the abovementioned disadvantages.

It is another object of the invention to provide improved means ensuring that a semiconductor device is durably secured in good heat transfer relationship to a heat dissipation plate in simple manner.

The invention accomplishes these objects by the provision of a semiconductor device with a heat dissipation member comprising a metallic support block for supporting the semiconductor device, characterized by a retaining annulus engaging the support block and including an axial projection on the periphery of one end thereof abutting against the heat dissipation plate, said projection being welded to the plate to maintain the support block in pressure contact with the heat dissipation plate.

Preferably, a soft metal may fill a gap formed between the support block and the heat dissipation plate.

BRIEF DESCRIPTION OF THE DRAWING

The invention will become more readily apparent from the following detailed description taken in conjunction with the accompanying drawing in which.

Throughout the figures like reference numerals designate the corresponding or similar components.

DESCRIPTION OF THE INVENTION

Figure 1:
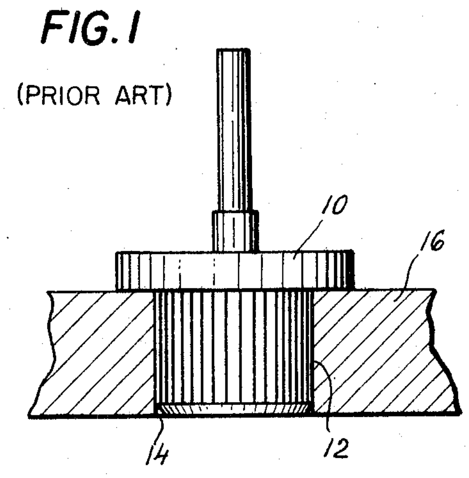
FIG. 1 (PRIOR ART)
FIGS. 1 to 3 inclusive are side elevational views, partly in section of semiconductor devices mounted to the associated heat dissipation plates in accordance with the principles of the prior art.

For a better understanding of the effectiveness of the invention the prior art practice will be first described. In FIG. 1 it is seen that a semiconductor device 10 has a knurled end portion 12 of circular cross section press fitted into a circular hole 14 formed with a diameter substantially equal to or slightly less than that of the knurled end portion 12 in a heat dissipation plate 16. This permits heat generated in the semiconductor device 10 to be effectively transferred to the heat dissipation plate 16. As previously described, however, the circular hole 14 should be machined with a high degree of machining accuracy and also the heat dissipation plate 16 could not be very thin. Furthermore the plate underwent a limitation as to the type of its material because the material had preferably a high limit of elasticity.

Figure 2:
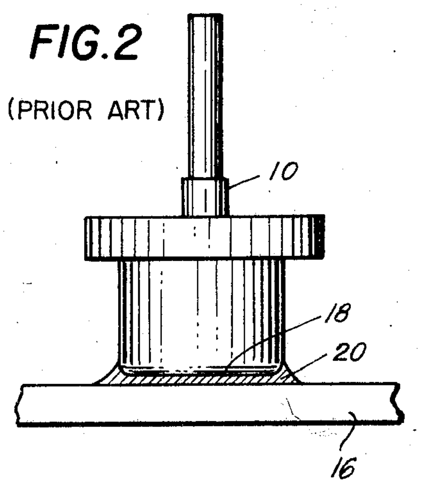
FIG. 2 (PRIOR ART)

FIG. 2 shows another mounting of a semiconductor device on a heat dissipation plate. As shown, the semiconductor device 10 has a bottom surface 18 brazed to the heat dissipation plate 16 by a layer 20 brazing material. The type of low melting-point solders comprising essentially tin and lead may be frequently used as the brazing material. This mounting is relatively simply accomplished but as previous described, the repeated heat cycles of the completed semiconductor device causes a fatigue failure of the brazing layer whose material is least in strength among the dissimilar materials for the bottom device surface 18, the layer 20 and the heat dissipation plate 16.

Figure 3:
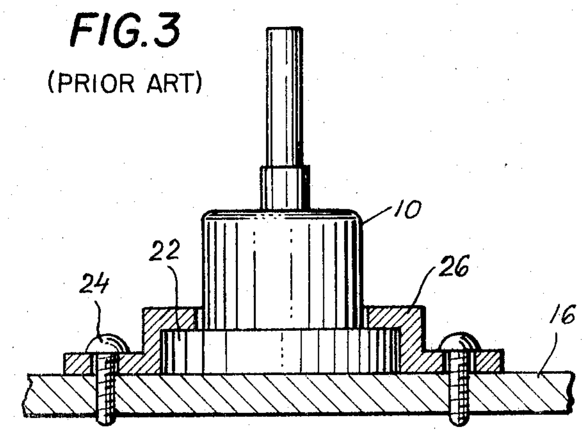
FIG. 3 (PRIOR ART)

Further a semiconductor device could be mounted to a heat dissipation plate in a manner as shown in FIG. 3. The semiconductor device 10 of circular cross section is secured to a circular support block 22 greater in diameter than the same. Then a flanged circular annulus 26, is fitted onto the support block 22 and fastened to a heat dissipation plate 16 by screws 24. This measure causes no fatigue failure as above described but it is disadvantageous in that the number of components involved increases as previously described.

The invention contemplates to elimination the abovementioned disadvantages of the prior art practice.

Figure 4:
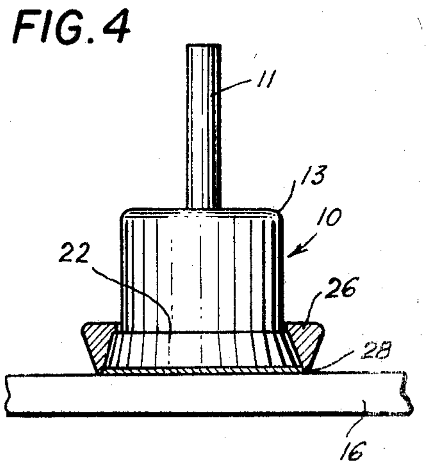
FIG. 4 is a side elevational view, partly in section of a semiconductor device mounted to a heat dissipation plate in accordance with the principles of the invention.
Figure 5:
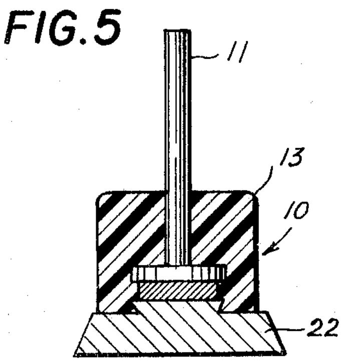
FIG. 5 is a fragmental longitudinal sectional view, partly in elevation of the device shown in FIG. 4.

Referring now to FIGS. 4 and 5, there is illustrated a semiconductor device mounted to a heat dissipation plate in accordance with the principles of the invention. A semiconductor device designated by the reference numeral 10 has a lead-in conductor 11 attached on one surface, in this case on upper surface thereof as viewed in FIG. 4 and a support block 22 of any suitable good thermally conductive material such as copper in the form of a truncated cone attached to the lower surface thereof with the smaller end face of the block contacting the lower surface of the device. The smaller end face of the support block 22 is somewhat greater in diameter than the semiconductor device 10. A protective layer 13 of any suitable material such as an epoxide resin is disposed on the exposed surface of the device to mechanically and physically protect the junctions of the device and the lead-in conduction and support block.

According to the principles of the invention the support block 22 has fitted onto the same by a retaining circular annulus 26 of any suitable metallic material such as iron having its internal peripheral surface complemental in configuration to the external peripheral surface of the block. The annulus 26 is further provided on the periphery of that end remote from the semiconductor device 10 or the lower end as viewed in FIG. 4 with an axial projection 28 adapted to be welded to a heat dissipation plate 16 as will be described hereinafter. The projection 28 of the annulus 26 as fitted onto the support block 22 has an extremity projecting downwardly beyond the lower surface of the support block 22 to such an extent that the extended portion of the projection is slightly less in length than that portion thereof collapsing by welding. The welding of the annulus 26 to a heat dissipation plate 16 is accomplished as by pushing a pair of resistance welding electrodes (not shown) against the upper and lower surfaces respectively of the annulus and plate followed by a high current instantaneously flowing therethrough. Thus the support block 22 is maintained in intimate contact and hence in good thermal transfer relationship with the heat dissipation plate 16 which may be made of any suitable good heat conductive material such as aluminum or copper.

It is to be noted that the shape, size and material of the retaining annulus 26 and the material of the heat dissipation plate 16 should be properly selected for the particular application.

In order to further improve the heat transfer from the semiconductor device 10 through the support block 22 to the heat dissipation plate 16, a thermally conductive material higher in thermal conductivity than air may preferably fill a gap formed between the support block and the heat dissipation plate. Soft metals such as lead and solders are preferred.

Figure 6:
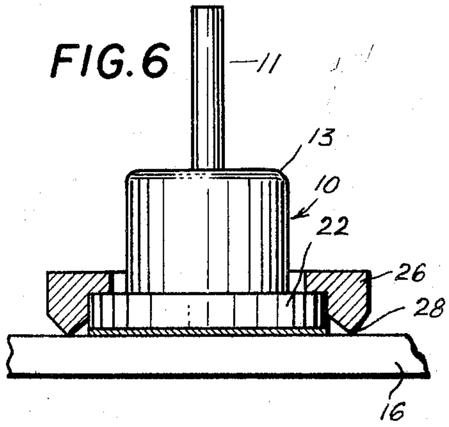
FIG. 6 is a view similar to FIG. 4 but illustrating a modification of the invention.

FIG. 6 shows an arrangement substantial identical to that illustrated in FIGS. 4 and 5 except for a flanged retaining annulus 26 engaging a support block 22 in the form of a cylinder.

While the invention has been illustrated and described in conjunction with a few embodiments thereof it is to be understood that numerous changes and modifications may be resorted to without departing from the spirit and scope of the invention.

What I claim is:

1. A semiconductor device with a heat dissipation member comprising a metallic support block for supporting said semiconductor device and a retaining annulus engaging said support block and including an axial projection on the periphery of one end thereof abutting against said heat dissipation plate, said projection being welded to said plate to maintain said support block in pressure contact with said heat dissipation plate.

2. A semiconductor device as claimed in claim 1 wherein a filling material higher in thermal conductivity than air fills a gap formed between said support block and said heat dissipation plate, said material being selected among soft metals.

References Cited

UNITED STATES PATENTS

| | | | |
|---|---|---|---|
| 3,146,384 | 8/1964 | Ruehle | 317—234 |
| 3,287,604 | 11/1966 | Mroz et al. | 317—100 |
| 3,377,524 | 9/1968 | Back et al. | 317—234 |

JAMES D. KALLAM, Primary Examiner

U.S. Cl. X.R.

317—235